United States Patent [19]
Ristic et al.

[11] Patent Number: 5,146,389
[45] Date of Patent: Sep. 8, 1992

[54] DIFFERENTIAL CAPACITOR STRUCTURE AND METHOD

[75] Inventors: Ljubisa Ristic, Phoenix; William C. Dunn, Mesa, both of Ariz.

[73] Assignee: Motorola, Inc., Schaumburg, Ill.

[21] Appl. No.: 733,920

[22] Filed: Jul. 22, 1991

[51] Int. Cl.⁵ .................. H10G 7/00; G01P 15/125
[52] U.S. Cl. .......................... 361/283; 73/517 AV
[58] Field of Search ................. 361/320, 321, 283; 73/517 R, 517 AV, 516; 29/25.42

[56] References Cited

U.S. PATENT DOCUMENTS

| | | | |
|---|---|---|---|
| 4,435,737 | 3/1984 | Colton | 73/517 R X |
| 4,736,629 | 4/1988 | Cole | 73/517 R |
| 5,006,487 | 4/1991 | Stokes | 73/517 AV X |
| 5,045,152 | 9/1991 | Sickafus | 156/653 |

*Primary Examiner*—Donald A. Griffin
*Attorney, Agent, or Firm*—Harry A. Wolin

[57] ABSTRACT

A differential capacitor structure includes a first static conductive layer and a second static conductive layer not electrically coupled to the first static conductive layer. A dynamic conductive layer is suspended between the first and second static conductive layers.

39 Claims, 2 Drawing Sheets

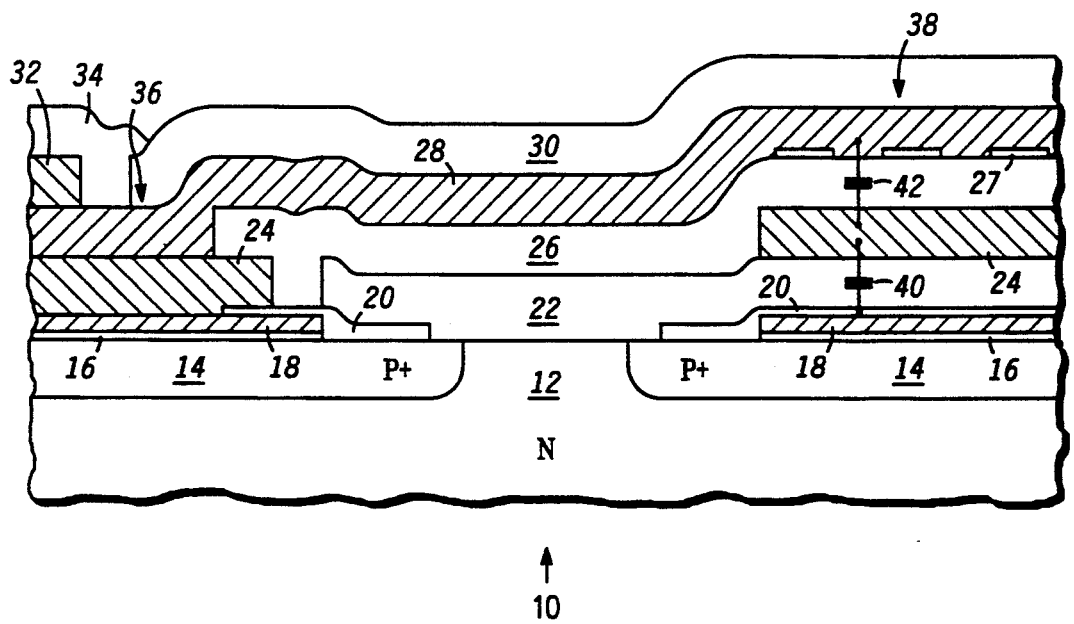
FIG. 1
FIG. 2
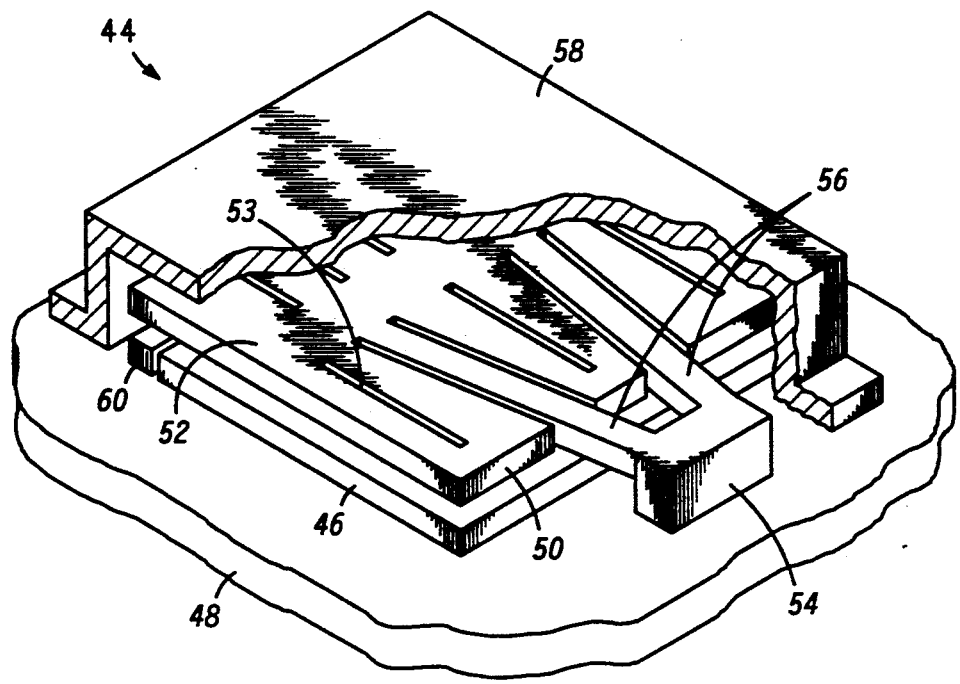

DIFFERENTIAL CAPACITOR STRUCTURE AND METHOD

FIELD OF THE INVENTION

This invention relates, in general, to the semiconductor arts, and more particularly to a differential capacitor structure and method.

BACKGROUND OF THE INVENTION

Solid state capacitor structures are well known in the art and employed for a variety of applications such as sensors, accelerometers, actuators and the like. The vast majority of well known capacitor structures generally include two conductive plates and measure only the capacitance therebetween. There are relatively few integrated capacitor structures capable of measuring differential or relative capacitances.

U.S. Pat. No. 4,736,629 entitled "Micro-Miniature Accelerometer" issued to John Cole on Apr. 12, 1988 discloses an accelerometer structure that may measure two distinct capacitances to determine differential or relative capacitance. The structure disclosed by the '629 patent comprises a substrate having a cavity in which a mounting system is disposed. A torsion bar or beam connects the mounting system to a moveable plate so that the plate is positioned above the substrate and can rotate about a flexure axis that is above and substantially parallel to the substrate. The flexure axis divides the sensing element into two separate sections. Basically, the structure is similar to a see-saw.

A first electrode is mounted by the substrate adjacent the first section of the sensing element and forms a first capacitor while a second electrode is mounted by the substrate adjacent to the second section of the sensing element and forms a second capacitor. A detector for measuring the relative capacitance of the first and second capacitors is provided.

Although the structure taught by the '629 patent is adequate for many applications, it has substantial drawbacks that make its use less than optimum. To have adequate sensitivity, the cantilevered see-saw structure requires distance between the first and second sections of the sensing element. This requires relatively long arms and a large amount of area. Additionally, the torsion bar structure must be asymmetric so that the center of mass is offset and differential capacitance may be measured. Further, the structure is relatively difficult and expensive to fabricate.

Accordingly, it would be highly desirable to have a differential capacitor structure that is small in size, symmetric and that may be manufactured relatively easily and inexpensively.

SUMMARY OF THE INVENTION

A differential capacitor structure includes first and second static conductive layers and a dynamic conductive layer suspended therebetween. Neither the first and second static layers or the dynamic layer are electrically coupled. Differential capacitance may be detected by measuring and comparing the capacitance between the dynamic layer and the first static layer and also between the dynamic layer and the second static layer.

BRIEF DESCRIPTION OF THE DRAWINGS

FIG. 1 is a highly enlarged cross-sectional view of a portion of a differential capacitor structure during processing in accordance with the present invention;

FIG. 2 is a highly enlarged isometric view of an embodiment of a differential capacitor structure in accordance with the present invention;

DETAILED DESCRIPTION OF THE DRAWINGS

Figure 3:
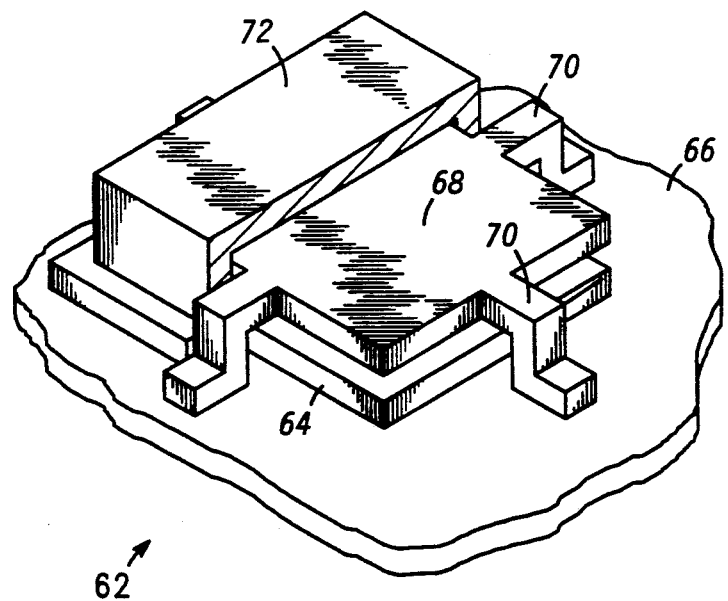
FIG. 3 is a highly enlarged isometric view of another embodiment of a differential capacitor structure in accordance with the present invention.

FIG. 1 is a highly enlarged cross-sectional view of a portion of a differential capacitor structure 10 during processing in accordance with the present invention. Structure 10 includes a substrate 12. Substrate 12 comprises monocrystalline silicon and has an N conductivity type herein. Optional conductive regions 14 having a P+ conductivity type are formed in substrate 12 to reduce parasitic capacitance. Conductive regions 14 may be formed by well known processes that include implantation and diffusion. Although a silicon substrate is depicted herein, it should be understood that other semiconductor or non-conductive substrates may be employed. This of course, is dependent upon the specific application for which structure 10 is to be employed.

An insulating layer 16 is formed on the surface of substrate 12. As shown herein, insulating layer 16 comprises silicon dioxide although other insulating materials may employed. Insulating layer 16 may be formed conformally and then patterned and etched. It serves to insulate first conductive layer 18 from substrate 12. It should be understood that if substrate 12 is non-conductive, insulating layer 16 would not be necessary.

First conductive layer 18 comprises polysilicon herein although other conductive materials may be employed. First conductive layer 18 may be formed by many well known methods including deposition and sputtering. First conductive layer 18 is formed conformally over the entire surface of substrate 12 and is then patterned and etched as desired. A protective layer 20 is disposed over first conductive layer 18 to protect insulating layer 16 during future processing steps and to prevent shorting and/or welding between first conductive layer 18 and second conductive layer 24 (to be explained presently). As shown herein, protective layer 20 comprises silicon nitride that is deposited conformally and then patterned and etched as desired.

A first sacrificial layer 22 is formed on patterned first conductive layer 18. First sacrificial layer 22 is also formed conformally and then patterned and etched as desired. The thickness of first sacrificial layer 22 may be varied depending upon the distance that is desired between the first conductive layer 18 and the second conductive layer 24 (to be explained presently). First sacrificial layer 22 comprises phosphosilicate glass and is deposited by chemical vapor deposition. It should be understood that other sacrificial materials may be employed in place of phosphosilicate glass.

A second conductive layer 24, also comprising polysilicon herein, is formed on patterned sacrificial layer 22. Second conductive layer 24 is also formed conformally and etched and patterned appropriately. A second sacrificial layer 26 is formed on patterned second conductive layer 24. Second sacrificial layer 26 comprises phosphosilicate glass herein that is formed conformally and then patterned and etched. A protective layer 27 comprising silicon nitride herein is formed on second sacrificial layer 26. Protective layer 27 is formed conformally and patterned and etched as desired. Protective layer 27 prevents shorting and/or welding between third conductive layer 28 (to be explained presently) and second conductive layer 24. As shown, protective layer 27 comprises segments. This relieves internal stress.

A third conductive layer 28 is formed on patterned second sacrificial layer 26. Third conductive layer 28 also comprises polysilicon in this embodiment and is formed conformally and then patterned and etched accordingly. A third sacrificial layer 30 is formed on patterned third conductive layer 28. Third sacrificial layer 30 comprises phosphosilicate glass herein and is also formed conformally, patterned and etched. Third sacrificial layer 30 protects third conductive layer 28 during the deposition of metal layer 32 (to be explained presently).

A first metal layer 32 is formed following the patterning and etching of third sacrificial layer 30. The portion of metal layer 32 shown in FIG. 1 is disposed on a portion of third conductive layer 28 although first metal layer 32 may be formed on other layers as desired for specific applications. Following the formation of first metal layer 32, a protective layer 34 is formed to protect first metal layer 32. As shown herein, protective layer 34 comprises silicon nitride formed by a plasma deposition. Protective layer 34 is formed conformally on the surface of structure 10 and then patterned and etched accordingly.

Following the formation of structure 10 as shown, sacrificial layers 22, 26 and 30 are removed. A selective etchant that will remove phosphosilicate glass sacrificial layers 22, 26 and 30 without appreciably damaging the polysilicon of conductive layers 18, 24 and 28 or the nitride of protective layers 20 and 27 must be employed. A 6:1 HF solution will remove phosphosilicate glass sacrificial layers 22, 26, and 30 without damaging polysilicon conductive layers 18, 24 and 28 and only minimally etching nitride protective layers 20 and 27. It should be understood that other materials may be used for the conductive, sacrificial and protective layers as long as a selective etchant is available to selectively remove sacrificial layers 22, 26 and 30.

The removal of sacrificial layers 22, 26 and 30 may be performed significantly faster if conductive layers 24 and/or 28 are patterned and etched to include a plurality of perforations that more readily expose sacrificial layers 22, 26 and 30 to the selective etchant. Perforations formed in second conductive layer 24 may also be used to adjust damping.

The portion of structure 10 depicted by FIG. 1 includes a pillar 36 that comprises physically coupled portions of conductive layers 18, 24 and 28. Pillar 36 serves to support third conductive layer 28 following the removal of sacrificial layers 22, 26 and 30. It is important that pillar 36 only be electrically coupled to one conductive layer in the capacitive portion 38 of structure 10. As shown, pillar 36 is only electrically coupled to third conductive layer 28 in capacitive portion 38 of structure 10.

Capacitive portion 38 of structure 10 includes a first capacitor 40 and a second capacitor 42. First capacitor 40 is governed by the capacitance between first conductive layer 18 and second conductive layer 24 while capacitor 42 is governed by the capacitance between second conductive layer 24 and third conductive layer 28. Structure 10 is designed so that first conductive layer 18 is static by virtue of being disposed on substrate 12 and third conductive layer 28 is also static by virtue of being rigidly supported by pillar 36 and additional pillars (not shown). Second conductive layer 24 in capacitive portion 38 is a dynamic layer and will flex by design. A support (not shown) will support second conductive layer 24 while still allowing it to flex between conductive layers 18 and 28. As mentioned earlier, damping of second conductive layer 24 may be adjusted by the formation of perforations therein.

Differential capacitor structure 10 may be employed as an open or closed loop system. If structure 10 is employed as a closed loop structure, the mechanical fatigue effect of dynamic second conductive layer 24 is significantly reduced. When equal voltages are applied to first conductive layer 18 and second conductive layer 28, the capacitances of capacitors 40 and 42 will be equal and second conductive layer 24 will not flex thereby not subjecting structure 10 to mechanical fatigue. This assumes that second conductive layer 24 is an equal distance from first conductive layer 18 and third conductive layer 28.

FIG. 2 is a highly enlarged isometric view of a differential capacitor structure 44 in accordance with an embodiment of the present invention. Structure 44 is simplified in that not all layers and features are depicted. Layers and features not depicted are clearly set forth in the description of FIG. 1. Differential capacitor structure 44 includes a static first conductive layer 46 disposed on a substrate 48. A second conductive layer 50 includes a dynamic portion 52 disposed above first conductive layer 46. Second conductive layer 50 has a cantilevered configuration wherein dynamic portion 52 extends from mounting post 54 via two cantilevered arms 56. Mounting post 54 may be formed by physically coupling patterned portions of first conductive layer 46 and second conductive layer 50 so long as the portion derived from first conductive layer 46 is not electrically coupled to the portion of first conductive layer 46 which serves as a capacitive plate. Dynamic portion 52 of second conductive layer 50 includes perforations 53 therein. Perforations 53 are employed to decrease etch time as well as to adjust damping of dynamic portion 52. A third conductive layer 58 is formed over a second conductive layer 50 and first conductive layer 46. Third conductive layer 58 is in the form of a cap disposed over conductive layers 50 and 46. Capacitances are measured between first conductive layer 46 and second conductive layer 50 and also between second conductive layer 50 and third conductive layer 58. Differential capacitance may be obtained by comparing these two capacitances.

First conductive layer 46 includes a test segment 60. By applying a voltage to test segment 60 of first conductive layer 46 thereby simulating external forces, electrostatic forces may be created between test segment 60 and second conductive layer 50 allowing differential capacitor structure 44 to be tested.

FIG. 3 is a highly enlarged isometric view of a differential capacitor structure 62 in accordance with a specific embodiment of the present invention. Structure 62 is simplified in that not all layers and features are depicted. Layers and features not depicted are clearly set forth in the description of FIG. 1. Structure 62 includes a first conductive layer 64 disposed on a substrate 66. First conductive layer 64 is a static layer. A second conductive layer 68 is formed above first conductive layer 64. Second conductive layer 68 is dynamic and is supported and allowed to flex by plurality of cantilevered arms 70. Although four cantilevered arms are shown extending from each side of second conductive layer 68, it should be understood that the number and configuration of cantilevered arms 70 may be varied. A third conductive layer 72 is disposed above second conductive layer 68. Similar to third conductive layer 58 of FIG. 2, third conductive layer 72 is in the form of a cap disposed over second conductive layer 68 and first conductive layer 64. Again, differential capacitance may be obtained from the capacitance between first conductive layer 64 and second conductive layer 68 and the capacitance between second conductive layer 68 and third conductive layer 72.

Figure 4:
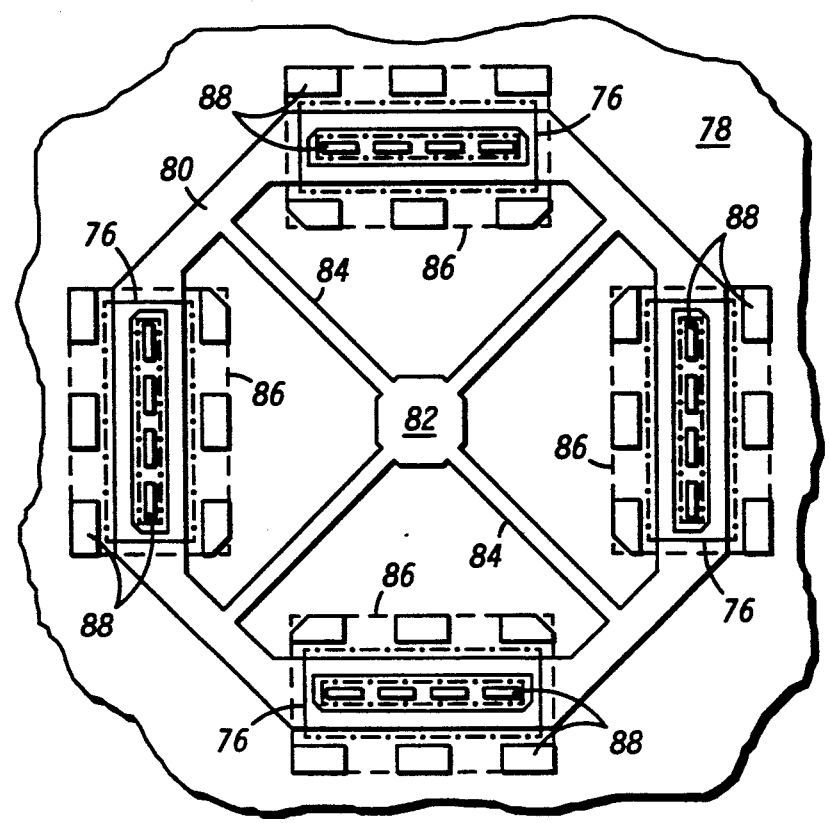
FIG. 4 is a highly enlarged top view of even another embodiment of a differential capacitor structure in accordance with the present invention.

FIG. 4 is a highly enlarged top view of a portion of a differential capacitor structure 74 in accordance with a specific embodiment of the present invention. A first conductive layer 76 is formed on a substrate 78. First conductive layer 76 is patterned into four separate non-electrically coupled regions represented by the dash-dot-dash (-.-) lines. Each of the regions of first conductive layer 76 is rectangular in shape with an opening in the middle. Since first conductive layer 76 is disposed on substrate 78, it is a static layer.

A second conductive layer 80 is disposed above first conductive layer 76. Second conductive layer 80 is a dynamic layer and is supported above first conductive layer 76 and substrate 78 by a single pillar 82 from which support arms 84 extend. The single pillar 82 configuration has the advantage of allowing reduced inherent stress upon outward expansion of second conductive layer 80. Single pillar 82 configuration also allows second conductive layer 80 to have maximum mass thereby increasing sensitivity. Pillar 82 is formed from portions of first conductive layer 76 and second conductive layer 80. However, it should be understood that the portion of first conductive layer 76 which is part of pillar 82 is not electrically coupled to the portions of first conductive layer 76 represented by the dash-dot-dash lines.

A third conductive layer 86 is represented by the dashed (--) lines. Third conductive layer 86 as shown includes four distinct non-electrically coupled regions. Each region of third conductive layer 86 is supported by 10 supports 88. Supports 88 are configured in such a manner that the regions of third conductive layer 86 will be static. It should be understood that although a specific configuration of supports 88 is shown herein, any configuration of supports 88 that allows the portions of third conductive layer 86 to remain static may be employed. Supports 88 comprise portions of first conductive layer 76, second conductive layer 80 and third conductive layer 86. It is important that supports 88 are not electrically coupled to the dynamic portions of second conductive layer 80 or the rectangular portions of first conductive layer 76.

As shown, differential capacitor structure 74 has four distinct differential capacitive regions. This allows for many desirable features. Structure 74 is symmetric. Structure 74 is a closed loop system wherein the mechanical fatigue effect of second conductive layer 80 is limited because it will remain stationary when equal voltage is applied to first conductive layer 76 and third conductive layer 86. Again, this assumes that first conductive layer 76 and third conductive layer 86 are equal distances from second conductive layer 80. Structure 74 further has a balancing feature. During processing, it is common that entire structure 74 may be tilted. Because structure 74 includes four separate capacitive regions, electrostatic forces may be employed to balance the structure. This feature may be implemented in any embodiment of the present invention having three or more capacitive regions. Structure 74 further has a self-test feature. Because first conductive layer 76 is segmented into multiple sections, voltages may be applied to various portions thereof thereby simulating actual operation and creating electrostatic forces between first conductive layer 76 and second conductive layer 80 to test structure 74. Perforations may also be formed in second conductive layer 80 and third conductive layer 86. As set forth above, the perforations allow processing to occur more rapidly and perforations disposed in second conductive layer 80 may also be used to adjust damping.

The sensitivity of structure 74 may be increased by increasing the mass of dynamic second conductive layer 80. The mass of second conductive layer 80 may be increased by forming metal or additional polysilicon thereon. The sensitivity of structure 74 may be adjusted by the amount the mass is increased.

Thus it is apparent that there has been provided, in accordance with the invention, an improved differential capacitor structure and method. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A differential capacitor structure comprising:
   a first static semiconductive layer;
   a second static semiconductive layer not electrically coupled to said first layer; and
   a dynamic semiconductive layer suspended between and not electrically coupled to said first and second layers.

2. The structure of claim 1 wherein the first layer is disposed on a substrate, said substrate being non-conductive or electrically isolated from said first layer.

3. The structure of claim 1 wherein protective layers are disposed on the first and second layers adjacent the dynamic layer.

4. The structure of claim 1 wherein one or both of the second and dynamic layers include perforations.

5. The structure of claim 1 wherein additional mass is disposed on the dynamic layer.

6. The structure of claim 1 wherein the dynamic layer is supported by a single pillar.

7. The structure of claim 1 wherein voltage is applied to the first layer to create electrostatic forces and test the structure.

8. The structure of claim 1 wherein the first layer comprises a plurality non-electrically coupled segments thereby allowing a plurality of capacitors in the single structure.

9. The structure of claim 8 wherein the plurality of capacitors is employed to balance the structure.

10. A differential capacitor structure comprising:

a substrate;

a first static polysilicon layer disposed on said substrate;

a second static polysilicon layer disposed a distance above and not electrically coupled to said first layer; and a dynamic polysilicon layer suspended between and not electrically coupled to said first and second layers.

11. The structure of claim 10 wherein the substrate is non-conductive or electrically isolated from said first layer.

12. The structure of claim 11 wherein silicon nitride protective layers are disposed on the first and second layers adjacent the dynamic layer.

13. The structure of claim 12 wherein one or both of the second and dynamic layers include perforations.

14. The structure of claim 13 wherein the dynamic layer is supported by a single pillar.

15. The structure of claim 14 wherein additional mass is disposed on the dynamic layer.

16. The structure of claim 15 wherein voltage is applied to the first layer to create electrostatic forces and test the structure.

17. The structure of claim 16 wherein the first layer comprises a plurality of non-electrically coupled segments thereby allowing a plurality of differential capacitors in the single structure.

18. The structure of claim 17 wherein the plurality of differential capacitors is employed to balance the structure.

19. A differential capacitor structure comprising:

a substrate;

a first static conductive layer;

a second static conductive layer not electrically coupled to said first layer;

a dynamic conductive layer suspended between and not electrically coupled to said first and second layers; and wherein said structure is fabricated by forming said first static layer on said substrate, forming a first sacrificial layer on said first static layer, forming said dynamic layer on said first sacrificial layer, forming a second sacrificial layer on said dynamic layer, forming said second static layer on said second sacrificial layer and removing said first and second sacrificial layers.

20. The structure of claim 19 wherein the substrate is non-conductive or electrically isolated from said first static layer.

21. The structure of claim 20 wherein protective layers are disposed on the first and second layers adjacent the dynamic layers.

22. The structure of claim 20 wherein one or both of the second and dynamic layers include perforations.

23. The structure of claim 20 wherein additional mass is disposed on the dynamic layer.

24. The structure of claim 20 wherein the dynamic layer is supported by a single pillar.

25. The structure of claim 20 wherein voltage is applied to the first static-layer to create electrostatic forces and test the structure.

26. The structure of claim 20 wherein the first static layer comprises a plurality of non-electrically coupled segments thereby allowing a plurality of differential capacitors in the single structure.

27. The structure of claim 26 wherein the plurality of differential capacitors is employed to balance the structure.

28. The structure of claim 20 wherein the first static, second static and dynamic layers comprise polysilicon and the sacrificial layers comprise phosphosilicate glass.

29. The structure of claim 28 wherein the sacrificial layers are removed by selectively etching said sacrificial layers with an HF solution.

30. The structure of claim 20 further comprising a first metal layer formed following the formation of a third sacrificial layer on the second static layer.

31. A method of fabricating a differential capacitor structure comprising the steps of:

providing a substrate;

forming a first static conductive layer on said substrate;

forming a first sacrificial layer on said first conductive layer;

forming a dynamic conductive layer on said first sacrificial layer;

forming a second sacrificial layer on said dynamic layer;

forming a second static conductive layer on said second sacrificial layer; and selectively removing said sacrificial layers.

32. The method of claim 31 wherein the providing a substrate step includes providing a non-conductive substrate or a substrate to be electrically isolated from the first conductive layer.

33. The method of claim 32 further including the steps of forming protective layers on the first and second conductive layers adjacent the dynamic layer.

34. The method of claim 32 wherein the first and second conductive layers, the dynamic layer and the sacrificial layers are each patterned and etched following their respective formation so that said dynamic layer is suspended between said first and second conductive layers and so that neither said first or second conductive layers or said dynamic layer are electrically coupled.

35. The method of claim 34 wherein the patterning and etching of the second conductive and dynamic layers includes patterning and etching perforations into one or both of said layers.

36. The method of claim 34 further including the step of forming additional mass on the dynamic layer.

37. The method of claim 34 further comprising, prior to the selectively removing step, the steps of:

forming a third sacrificial layer on the second conductive layer;

patterning and etching said third sacrificial layer; and forming at least one metal layer on exposed portions of one or more conductive layers.

38. The method of claim 34 wherein the first and second conductive layers and the dynamic layer comprise polysilicon and the sacrificial layers comprise phosphosilicate glass.

39. The method of claim 38 wherein the selectively removing step includes etching away the sacrificial layers with an HF solution.

* * * * *